United States Patent [19]
Forrest et al.

[11] Patent Number: 5,518,934
[45] Date of Patent: May 21, 1996

[54] METHOD OF FABRICATING MULTIWAVELENGTH INFRARED FOCAL PLANE ARRAY DETECTOR

[75] Inventors: Stephen R. Forrest; Gregory H. Olsen, both of Princeton; Dong-Su Kim, Lawrenceville, all of N.J.; Michael J. Lange, Morrisville, Pa.

[73] Assignee: Trustees of Princeton University, Princeton, N.J.

[21] Appl. No.: 364,671

[22] Filed: Dec. 23, 1994

Related U.S. Application Data

[62] Division of Ser. No. 278,617, Jul. 21, 1994.

[51] Int. Cl.$^6$ .................................................. H01L 31/18
[52] U.S. Cl. .............................. 437/3; 257/440; 437/5; 437/119; 437/127; 117/56
[58] Field of Search .................................. 437/3, 5, 119, 437/127; 117/56; 257/440

[56] References Cited

U.S. PATENT DOCUMENTS

| | | | |
|---|---|---|---|
| 4,148,045 | 4/1979 | Fang et al. | 437/127 |
| 5,138,416 | 8/1992 | Brillson | 257/440 |
| 5,380,669 | 1/1995 | Norton | 437/3 |
| 5,391,896 | 2/1995 | Wanlass | 257/440 |

FOREIGN PATENT DOCUMENTS

| | | | |
|---|---|---|---|
| 8105569 | 6/1983 | Japan | 257/440 |
| 2292873 | 12/1990 | Japan | 257/440 |

OTHER PUBLICATIONS

G. H. Olsen, "InGasAs Fills the Near–IR Detector Array Vacuum," Laser Focus World 27, pp. A21–A30, (1991).

G. H. Olsen and A. M. Joshi, "Room Temperature InGaAs Arrays for 2.5 mm Spectroscopy," Proc. SPIE 1157, pp. 276–282, (San Diego, 1989).

G. H. Olsen, "Interfacial Lattice Mismatch Effects in III–V Compounds," J. Crystal Growth, 31, pp. 223–239, (1975).

A. J. Moseley, M. D. Scott, A. H. Moore, and R. H. Wallis, "High–Efficiency, Low–Leakage MOCVD–Grown GaInAs/AlInAs Heterojunction Photodiodes for Detection to 2.4 mm," Electron Letters, 22, pp. 1207–1208, (1986).

R. A. Martinellli, T. J. Zamerowski, and P. A. Longeway, "2.6 mm InGaAs Photodiodes", Appl. Phys. Lett., 53, pp. 989–991, (1988).

G. H. Olsen, S. M. Mason, G. A. Gasparian, A. M. Joshi, K. M. Woodruff and V. S. Ban, "Room Temperature Properties of InGaAs Detectors Optimized for 1.8, 2.1, and 2.5 mm," Proc. IEEE LEOS Conf., (Boston, 1990).

K. Makita, T. Torikai, H. Ishihara, and K. Taguchi, "Ga1–yInyAs/ In AsxP1–x (y>0.53, x>0) pin Photodiodes for Long Wavelength regions (l>2 mm) Grown by Hydride Vapour Phase Epitaxy," Electron. Letters, 24, pp. 379–380, (1988).

O. K. Kim, B. V. Dutt, R. J. McCoy, and J. R. Zuber, "A Low Dark–Current, Planar InGaAs p–i–n Photodiode with a Quaternary InGaAsP Cap layer," IEEE J. Quantum Electron., QE–21, No. 2, pp. 138–143, (1985).

(List continued on next page.)

*Primary Examiner*—R. Bruce Breneman
*Assistant Examiner*—Ramamohan Rao Paladugu
*Attorney, Agent, or Firm*—Watov & Kipnes

[57] ABSTRACT

A multiwavelength local plane array infrared detector is included on a common substrate having formed on its top face a plurality of $In_xGa_{1-x}As$ ($x \leq 0.53$) absorption layers, between each pair of which a plurality of $InAs_yP_{1-y}$ ($y \leq 1$) buffer layers are formed having substantially increasing lattice parameters, respectively, relative to said substrate, for preventing lattice mismatch dislocations from propagating through successive ones of the absorption layers of decreasing bandgap relative to said substrate, whereby a plurality of detectors for detecting different wavelengths of light for a given pixel are provided by removing material above given areas of successive ones of the absorption layers, which areas are doped to form a pn junction with the surrounding unexposed portions of associated absorption layers, respectively, with metal contacts being formed on a portion of each of the exposed areas, and on the bottom of the substrate for facilitating electrical connections thereto.

21 Claims, 8 Drawing Sheets

1

| Composition | Bandgap | | Thickness | |
|---|---|---|---|---|
| n- InAs.6P.4 | 0.68 eV | 1.82 μm | 1 μm | 31 |
| n- In.85Ga.15As | 0.47 eV | 2.64 μm | 3 μm | 13 |
| n- InAs.6P.4 | 0.68 eV | 1.82 μm | 1 μm | 19 |
| n- InAs.5P.5 | 0.77 eV | 1.61 μm | 1 μm | 29 |
| n- InAs.4P.6 | 0.88 eV | 1.41 μm | 1 μm | 27 |
| n- In.7Ga.3As | 0.60 eV | 2.07 μm | 3 μm | 11 |
| n- InAs.3P.7 | 0.99 eV | 1.25 μm | 1 μm | 17 |
| n- InAs.2P.8 | 1.10 eV | 1.13 μm | 1 μm | 25 |
| n- InAs.1P.9 | 1.22 eV | 1.02 μm | 1 μm | 23 |
| n- InP | 1.35 eV | 0.92 μm | 1 μm | 21 |
| n- In.53Ga.47As | 0.75 eV | 1.65 μm | 3 μm | 9 |
| n+ InP Substrate | 1.35 eV | 0.92 μm | | 15 |

OTHER PUBLICATIONS

S. R. Forrest, "Performance in InxGa1-xAsyP1-y Photodiodes with Dark Current Limited by Diffusion, Generation Recombination, and Tunneling," IEEE J. Quantum Electron., QE-17, No. 2, pp. 217-226, (1981).

T. P. Lee, J. C. Campbell, K. Ogawa, A. R. McCormick, A. G. Dentai, C. A. Burrus, "Dual Channel 1.5 Mb/s Lightwave Receiver Employing An InGaAsP Wavelength-Demultiplexing Detector," Electronics Letters, vol. 15, pp. 388-389 (1979).

J. C. Campbell, T. P. Lee, A. G. Dentai, and C. A. Burrus, "Dual-Wavelength Demultiplexing InGaAsP Photodiode", Appl. Phys. Letters 34(6), pp. 401-402 (Mar. 15, 1979).

Dong-Su Kim and Stephen R. Forrest, "An Integrated Three Wavelength $In_xGa_{1-x}As$ Infrared Detector", Integrated Photonics Research, 1994 Technical Digest Series vol. 3, Feb. 17-19, 1994, San Francisco, Cal., pp. 248-250.

METHOD OF FABRICATING MULTIWAVELENGTH INFRARED FOCAL PLANE ARRAY DETECTOR

GOVERNMENT RIGHTS

This invention was made with Government support under Contract No. N00014-93-1-0223P00001, awarded by the Office of Naval Research, Department of Defense, and NASA Jet Propulsion Laboratory, under contract No. NAS7-1304. The Government has certain rights in this invention.

This is a divisional application of U.S. Ser. No. 08/278,617 filed on Jul. 21, 1994.

FIELD OF THE INVENTION

The present invention relates generally to infrared detectors, and more particularly to detectors for detecting light in the infrared of different wavelengths.

BACKGROUND OF THE INVENTION

Applications involving fiber optic communications systems typically utilize light waves having wavelengths in the near infrared (0.8 to 3.0 micrometers in wavelength). These systems presently represent the greatest usage for near infrared detectors. However, other applications such as temperature sensing, night vision, eye-safe range finding, process control, lidar, and wind-shear detection require detectors with higher sensitivity and faster response times in the near IR region. Recently, InGaAs detectors have been investigated for light detection at wavelengths greater than 1.65 µm because of their potential for high performance and reliability. Such detectors have demonstrated high quantum efficiencies (>70%), low dark current (<100 mA cm$^2$ at −5 V), and rise times less than one nanosecond at room temperature. Other materials (Ge, PbS, InSb, PtSi, HgCdTe, etc.) have been used for detectors at wavelengths greater than 2 µm, but they generally have to be cooled to low temperatures, often have very slow response, or have high dark currents.

Since $In_{0.53}Ga_{0.47}As$ detects light at wavelengths =1.65 µm, in order to detect longer wavelengths more indium must be added to the ternary compound, thereby decreasing the bandgap. In this case, the lattice parameter can no longer match that of the InP substrates. A graded layer technique has been developed to accommodate the lattice mismatch between the substrate ($a_o$= 5.869 Å) and the $In_xGa_{1-x}As$ (x >0.53) absorption layer ($a_o$>5.869 Å). In this technique, $InAs_yP_{1-y}$ (y≦1) buffer layers with increasing lattice parameters are grown in between the InP substrate and the absorption layer. This prevents lattice mismatch dislocations from propagating from layer to layer, enabling the growth of absorption layers with good optoelectronic properties. It is also possible to use $In_xGa_{1-x}As$ as grading layers by increasing the indium concentration. However, by using InAsP which has a larger bandgap than $In_xGa_{1-x}As$, better spectral response is obtained for back illumination (light enters through the substrate). Also, using larger bandgap materials as buffer layers results in detectors with lower dark current. InGaAs detectors with up to 2.6 µm cutoff wavelength using InAsP graded layers have been successfully fabricated with good opto-electronic properties.

SUMMARY OF THE INVENTION

In one embodiment of the invention, an infrared detector is provided in a plural wavelength InGaAs focal plane array pixel element for detecting a plurality of wavelengths of light over a predetermined range in the infrared or near infrared, where each of the wavelength sensitive detectors are formed on a common substrate, and are individually addressable. The detector consists of successively smaller bandgap layers of $In_xGa_{1-x}As$ (x≧0.53) formed over a substrate, separated by compositionally graded layers of $InAs_yP_{1-y}$ (y≦1) to decrease defects induced by lattice mismatch strain with the InP substrate. Portions of the various layers are selectively removed to form different pn junctions with different wavelength responses, respectively

BRIEF DESCRIPTION OF THE DRAWINGS

Various embodiments of the present invention are described below with reference to the drawings, in which like items are identified by the same reference designation, and in which.

DETAILED DESCRIPTION OF THE INVENTION

Figure 1A:
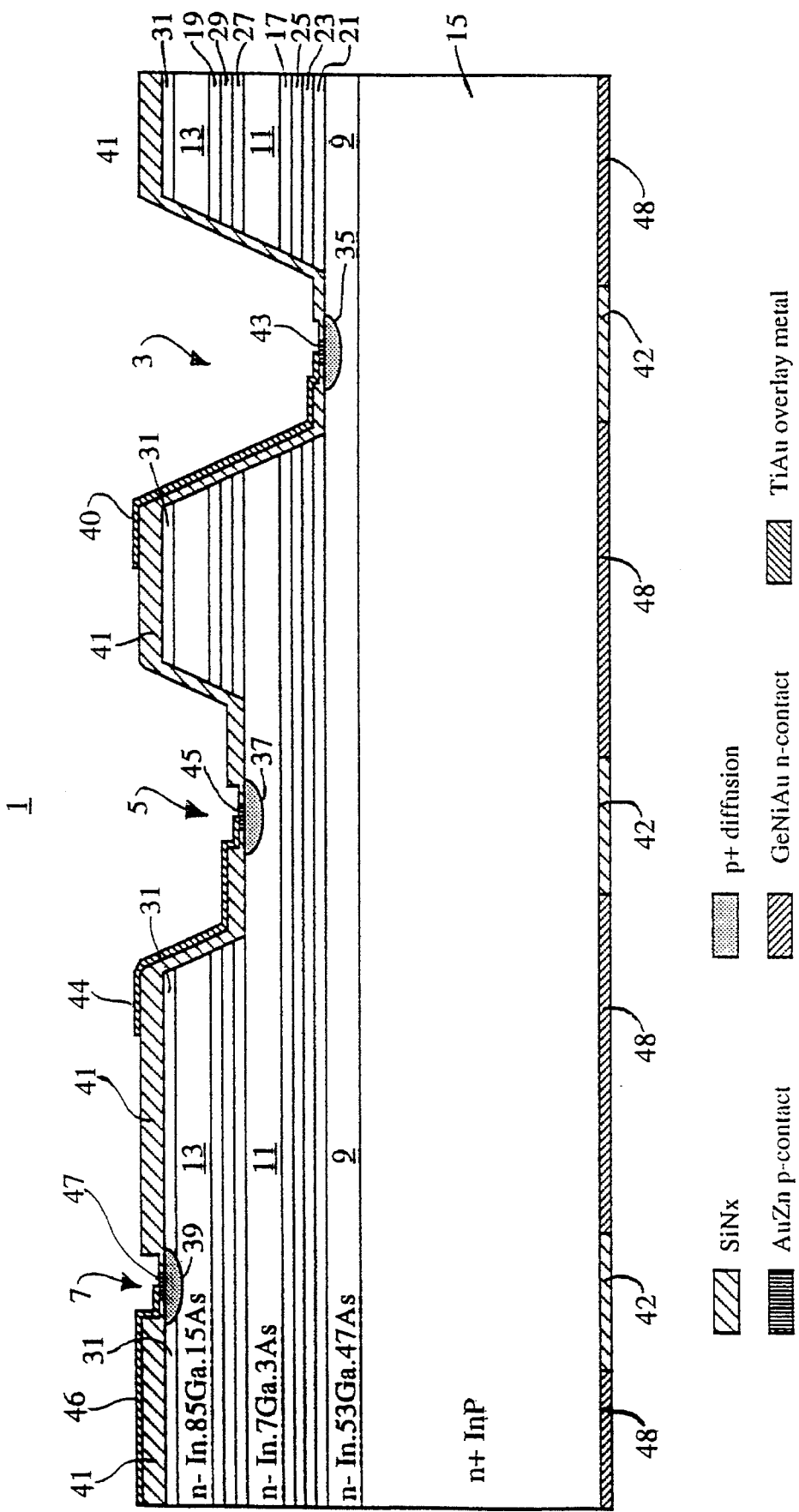
FIG. 1A is a cross sectional view of an engineering prototype for a three wavelength infrared detector in one embodiment of the invention.
Figures 1B, 1C:
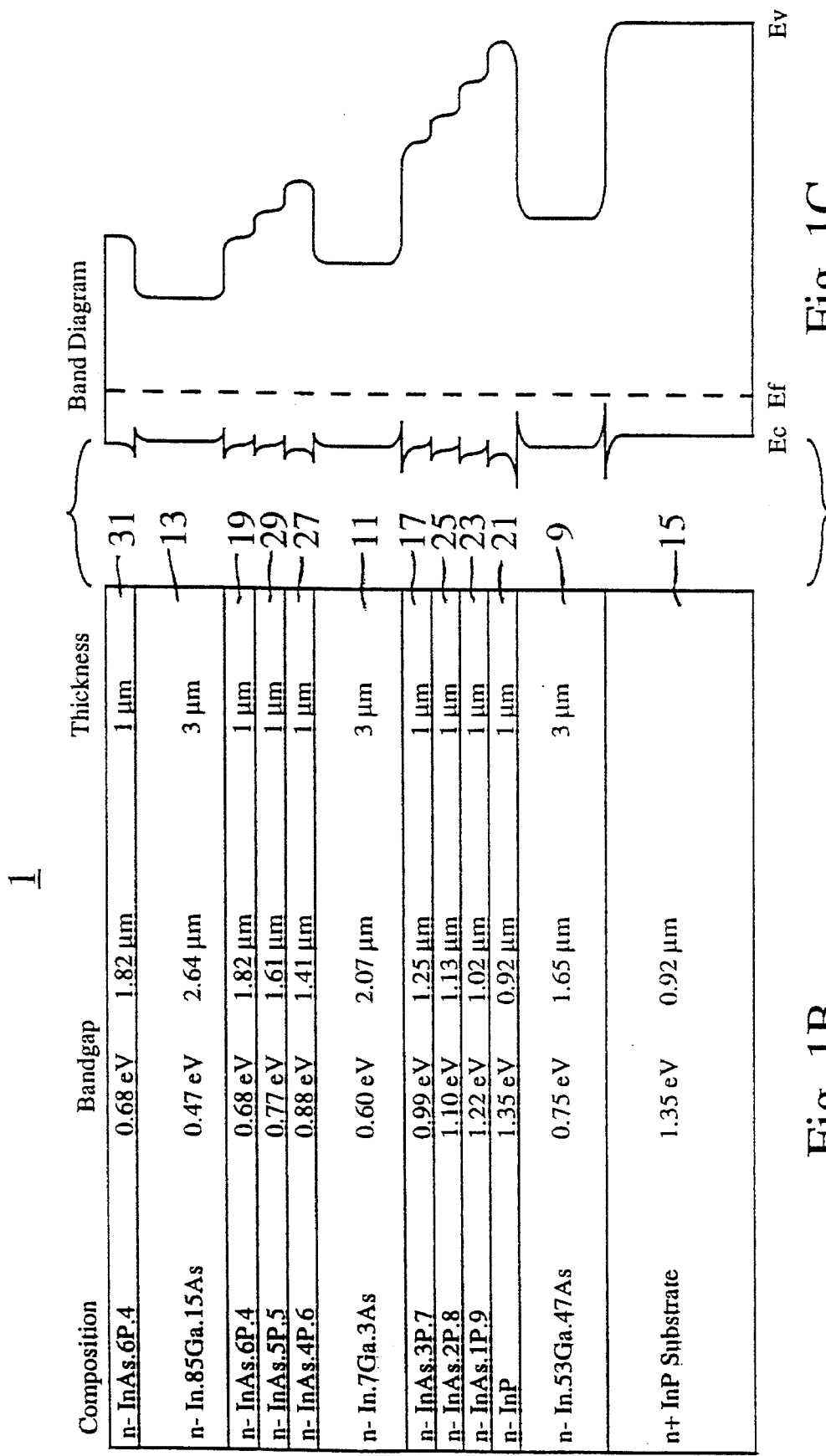
FIG. 1B is a pictorial and chart-like diagram showing for each layer of the device of FIG. 1A, the composition, bandgap, and thickness thereof, respectively.
FIG. 1C is a band diagram positioned in alignment with the corresponding layers of the device of FIG. 1B, for showing the relative bandgaps of each layer compared to the other, respectively.

In FIG. 1A, a prototype detector array pixel sensitive to three different selectable infrared wavelengths is shown, for one embodiment of the invention as developed for use as a focal plane array imaging device for applications such as gas spectroscopy and absolute temperature measurements (pyrometry). Since detectors with smaller bandgap which detect longer wavelength also have larger dark current, one can use this pixel to select the detector with the appropriate absorption layer to maximize the quantum efficiency while minimizing the dark current. The device 1 includes a plurality of integrated detector pixels, each including regions 3, 5, and 7 for detecting different wavelengths of light, respectively. In this example, the light is on the near infrared or infrared wavelength regions. Optical absorption occurs, with reference to FIG. 1B, in 3 μm thick $In_{0.53}Ga_{0.47}As$, $In_{0.7}Ga_{0.3}As$, and $In_{0.85}Ga_{0.15}As$ layers 9, 11, 13, respectively, which are grown by vapor phase epitaxy on top of an InP substrate 15, $InAs_{0.3}P_{0.7}$ layer 17, and $InAs_{0.6}P_{0.4}$ layer 19, respectively. The bandgaps of the absorption layers 9, 11, 13 are 0.75, 0.60, and 0.47 eV, respectively, which correspond to cutoff wavelengths of 1.65, 2.07, 2.64 μm, respectively. To accommodate the lattice mismatch between the absorption layers 9, 11, and 13, step-graded 1 μm thick InAsP buffer layers 21, 23, 25, 17, 27, 29, and 19 are grown. Thus, the respective lattice parameters of the $In_xGa_{1-x}As$ absorption layers matches the lattice parameter of the InAsP layers immediately underneath. The lattice parameter of the InAsP layers immediately above the absorption layers should also match, but in this structure the lattice parameter of $InAs_{0.4}P_{0.6}$ layer 27 does not exactly match that of $In_{0.7}Ga_{0.3}As$ absorption layer 11. This may be the source of somewhat elevated dark currents in the longer wavelength detectors. Accordingly, in a preferred device the lattice parameters of layers 27 and 1! should match. All the grown layers were undoped (with a background n-type carrier concentration of $<5 \times 10^{15}$ cm$^{-3}$), while the (100) InP substrate 15 was doped with sulfur to give an n-type doping density of $8 \times 10^{18}$ cm$^{-3}$. The band diagram in FIG. 1C shows the band gap and the band offsets between the different layers 15, 9, 21, 23, 25, 17, 11, 27, 29, 19, 13, and 31; and FIG. 1B shows the composition, bandgap in electron volts (eV) and equivalent wavelength in micrometers (μm), and the thickness in micrometers (μm), respectively.

Figure 4:
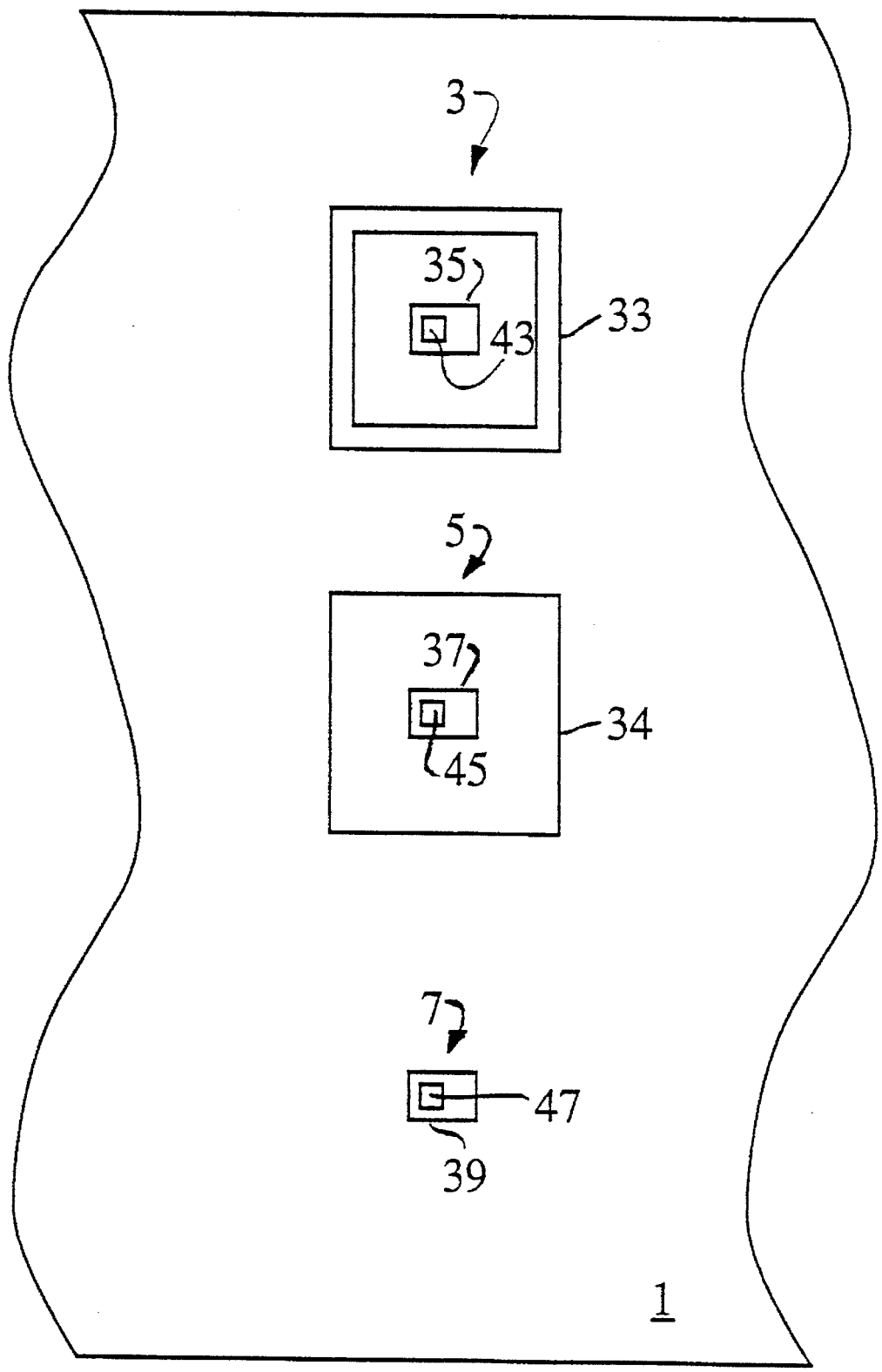
FIG. 4 is a top view of a portion of the device of FIG. 1A, showing three detector regions.

A selective wet etching process was developed in order to access the different absorption layers to enable junction diffusion for detection regions 3, 5, and 7, respectively (see FIG. 1A). A mixture of 5:1 citric acid (50% by weight):$H_2O_2$ was used to etch InGaAs detection layers since it is strongly selective of InGaAs (versus InAsP), and leaves a good surface morphology. The etch rate of $In_xGa_{1-x}As$ is ~1000 Å/min at room temperature. To etch InAsP layers, a mixture of $HCl:H_3PO_4:H_2O_2$ in the ratio of 3:1:x was used, where x was varied from 0 to 0.3 as the arsenic concentration in InAsP was increased. The etch rate of InAsP is ~200 Å/sec at room temperature. To fabricate the integrated detector array 1, a area square area 33 of 500 μm² (see FIG. 4) was first etched above the $In_{0.7}Ga_{0.3}As$ layer 11 and $In_{0.85}Ga_{0.15}As$ layer 13, using a plasma deposited $SiN_x$ film (1000 Å) as an etch mask, for initially forming detection region 3. Similarly, a 500 μm² area 34 was etched above layer 11 for initially forming detector region 5. Thin layers (1 μm thick) 21 and 27 of InAsP were left on top of the absorption layers in regions 3 and 5 as a wider bandgap cap layer in order to reduce surface-generated dark current. The pn junctions of all three detectors in regions 3, 5, and 7, respectively, were formed in 100 by 150 μm areas 35, 37, and 39, respectively, using a single sealed ampoule diffusion of Zinc Arsenide, with $SiN_x$ used as the diffusion mask. As a result, p+ diffusions were formed in regions 35, 37, and 39, thereby providing pn junctions with their underlying n doped absorption layers 9, 11, and 13. Next, an antireflection coating 41 of $SiN_x$ is deposited to a thickness of 2250 Å on the top diode surface (see FIG. 1A). Also, 40 μm square Au—Zn alloy contacts 43, 45, and 47 are placed on top of the diffused areas 35, 37, 39, respectively, using a photoresist lift-off process. Also, overlay metal contacts 40, 44, and 46, typically of TiAu material, are formed on top of the antireflective coating 41 in association with detectors 3, 5, and 7, for electrically contacting contacts 43, 45, and 47, respectively. Contacts 43, 45, and 47 facilitate making electrical connections either to individual ones of, or two or more of detectors 3, 5, and 7, respectively, using integrated circuitry techniques, such as flip-chip bonding, or wire bonding.

Figure 1D:
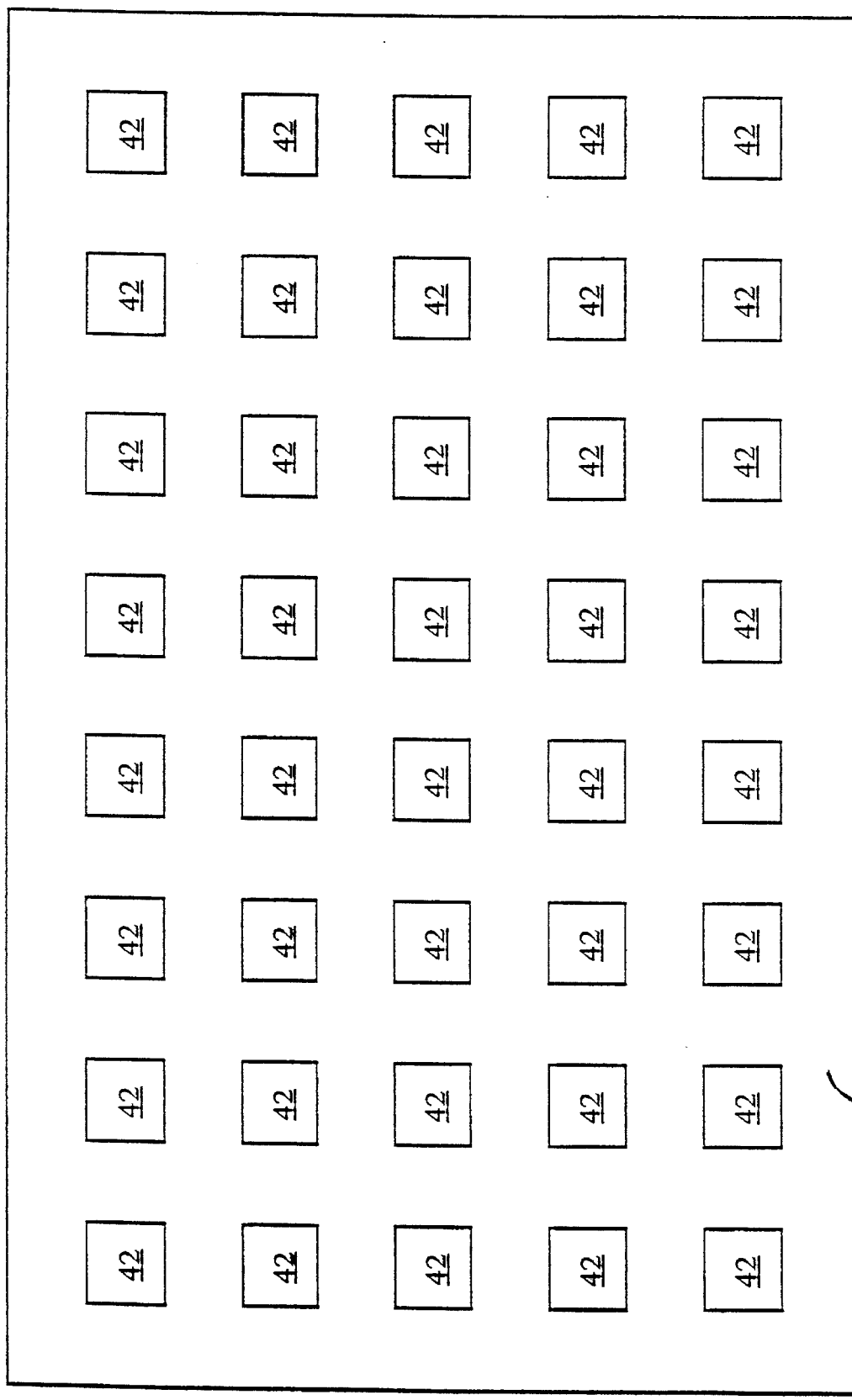
FIG. 1D shows the bottom of the detector of FIG. 1A, for a preferred embodiment thereof including an antireflective coating and ohmic contact grid thereon.

In order to maximize performance, the back surface of the detector array 1 or bottom of substrate 15 should preferably have an antireflection coating 42 of $SiN_x$, and an ohmic contact grid 48 (typically GeNiAu alloy), as shown in FIG. 1D. More specifically, in the preferred embodiment, the contact 48 is formed into a grid pattern with open spaces 42 for allowing backlighting or back illumination of the substrate 15 or detector 1. The open spaces 42 consist of a transparent antireflective coating of $SiN_x$, in this example. Each space 42 permits back illumination of an underlying absorption layer 9, 11, or 13, associated with a given detector 3, 5, or 7, of a pixel in an array of such pixels, in this example.

The basic processing steps for the three wavelength infrared focal plane array detector element 1 of FIG. 1A are summarized in eight steps as follows:

I. Deposit 1000 Å $SiN_x$ film by Plasma Enhanced Chemical Vapor Deposition (PECVD)

II. Photolithography to define etch area (500 μm square)

III. Material selective wet etching
   InGaAs: Citric Acid:$H_2O_2$ at 5:1
   InAsP: $HCl:H_3PO_4:H_2O_2$ at 3:1:x IV. Deposit 1000 $SiN_x$ diffusion mask V. Photolithography to define diffusion area (100 by 150 μm area)

VI. Sealed ampoule diffusion using $Zn_2As_3$ at 500°14 530° C. for 20–40 minutes VII. Deposit 2250 $SiN_x$ anti-reflective coating on top surface VIII. Place Au—Zn alloy contacts (40 μm square) on top of diffused area using photoresist lift-off process IX. Deposit SiNx AR coating on substrate surface X. Deposit GeNiAu on substrate surface over previously exposed and developed photoresist layer lift off metal to form grid pattern Note that in step II, a chrome or iron oxide photolithography mask can be used. In step III, in place of wet etching, reactive ion (dry) etching can be used. Also, in step IV, a silicon nitride mask is used.

Using capacitance versus voltage measurements, the inventors obtained the carrier concentration in the absorption layers 9, 11, and 13 for each detector 3, 5, and 7, respectively. It was determined that the background carrier concentration in the absorption layers 11 and 13 is $<1\times 10^{16}$ cm$^{-3}$, but higher for the $In_{0.53}Ga_{0.47}As$ layer 9 where the carrier concentration increases near the heavily doped substrate 15, due to the diffusion of the sulfur substrate dopant into the epitaxially grown layer. Also, at 0 V, the smaller bandgap materials have higher capacitance (2.1, 3.0, 7.8 pF for $In_{0.53}Ga_{0.47}As$, $In_{0.7}Ga_{0.3}As$, and $In_{0.53}Ga_{0.15}As$ layers 9, 11, and 13, respectively). In the operating range of 5–10 V, all diodes or pn junctions exhibit capacitances ranging from 1.2–2.0 pF, again with the short wavelength ($In_{0.53}Ga_{0.47}As$) detector 3 having the smallest capacitance.

Figure 2:
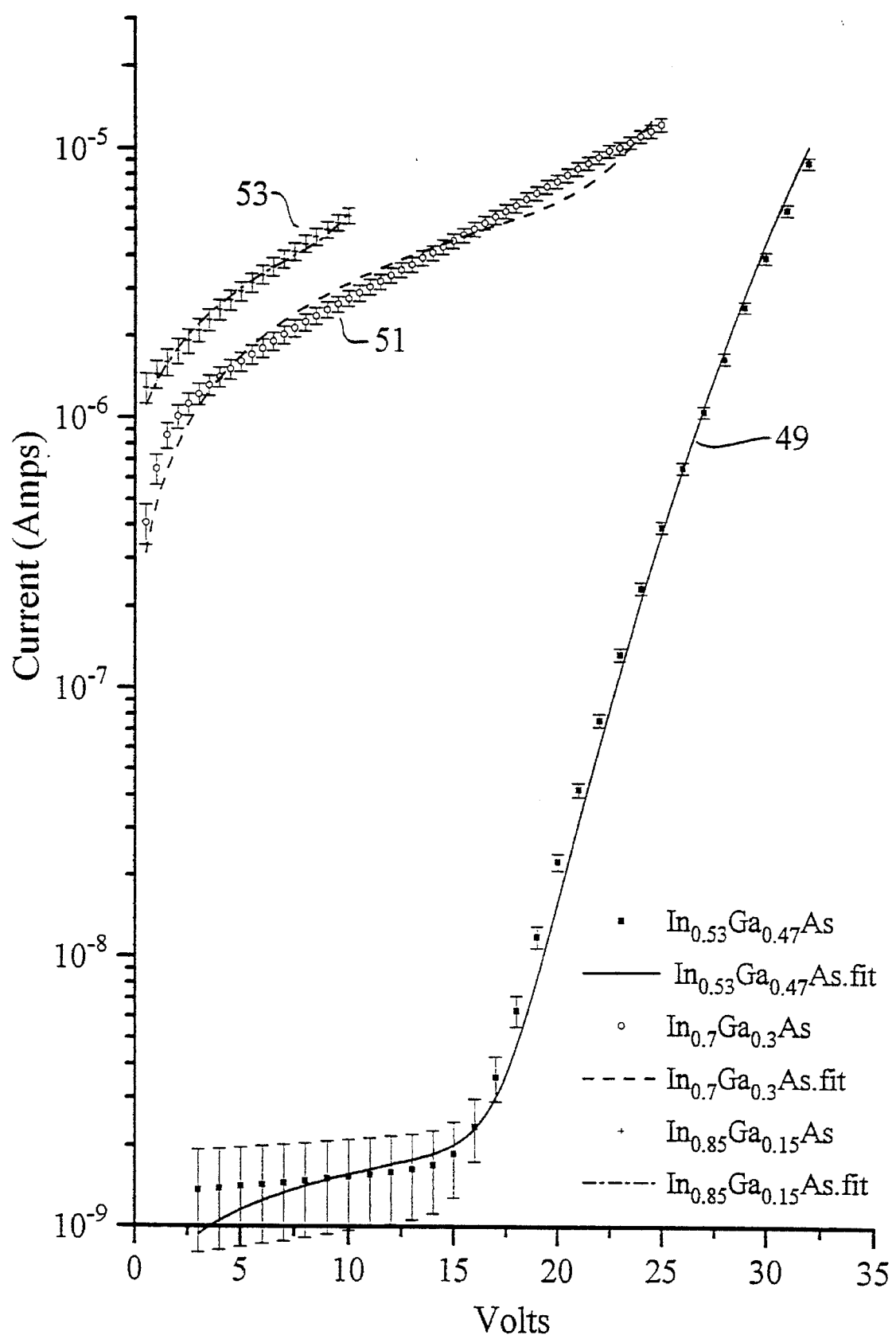
FIG. 2 shows a plot of the measured dark current of each one of the three detectors of the device of FIG. 1A under various conditions of reverse bias voltage.

The dark current of each detector 3, 5, and 7 under reverse bias is shown as points in FIG. 2, in plots 49, 51, and 53, for absorption layers 9, 11, and 13, respectively. The error bars were determined from the sum of measurement random error (determined to be five percent of the measured value) and small systematic errors. The lines are theoretical fits assuming that the total dark current is the sum of the generation-recombination current (either in the bulk or at the surface), junction shunt current, and diffusion current at low voltages, while tunneling dominates at high voltages, as has been shown to be the case in previous studies of InGaAs photodiodes.

The theory fits the measured data, especially for the $In_{0.53}Ga_{0.47}As$ layer 9 for detector 3. The main source of low voltage dark current for this detector is generation-recombination current which is (at V>kT) given by:

$$I_{gr} = \frac{qn_i AW}{\tau_{eff}} \quad (1)$$

where k is the Boltzman constant, T is the absolute temperature, q is the electronic charge, $\tau_{eff}$ is the effective carrier lifetime, $n_i$ is the intrinsic carrier concentration, A is the surface or cross-sectional area of the depletion region boundary, and W is the depletion region width for an abrupt one-sided junction. From the fit, the value of $\tau_{eff}$ is estimated to be 1 μs, indicating that the growth and processing of the complex structure shown in FIG. 1 does not significantly affect the diode properties. The tunneling current, which becomes dominant at V>15 volts for this detector 3, in this example, is given by:

$$I_{tun} \cong \gamma A \exp\left(\frac{\Theta m_o^{1/2} \epsilon_g^{3/2}}{q \eta E_m}\right) \quad (2)$$

where $m_o$ is the free electron mass, $\epsilon_g$ is the energy band gap of the absorbing layer material, η is Planck's constant divided by 2π, $E_m$ is the maximum junction electric field given by:

$$Em = -2(V+V_{bi})/W \quad (3)$$

and Θ depends on the shape of the tunneling barrier. Here, Θ was estimated to be 0.26 from the fit. The prefactor γ depends on the initial and final states of the tunneling carrier.

The dark currents of $In_{0.7}Ga_{0.3}As$ and $In_{0.85}Ga_{0.15}As$ detectors 5 and 7, respectively, are considerably larger than for the $In_{0.53}Ga_{0.47}As$ detector 3, especially at lower voltages. This is due, in part, to the smaller bandgap of the former materials which not only leads to an increased intrinsic carrier concentration affecting both the diffusion and the generation-recombination currents, but also leads to increased tunneling current. Another source of the high dark current is the larger concentration of defects in these materials caused by the lattice mismatch between the absorption layers 11 and 13, and the InP substrate 15. These defects provide midgap generation-recombination centers, increasing the generation-recombination current. Indeed, $\tau_{eff}$ for the $In_{0.7}Ga_{0.3}As$ layer 11 is estimated to be 110 ns, which is nearly an order of magnitude less than for $In_{0.53}Ga_{0.47}As$ layer 9.

The a.c. small signal conductance at 0 V was measured at 1 kHz to be 18.2 nS, 4.54 μS, 9.34 μS which translates to shunt resistances of 55.1 MΩ, 220 kΩ, and 107 ωk for $In_{0.53}Ga_{0.47}As$ layer 9, $In_{0.7}Ga_{0.3}As$ layer 11, and $In_{0.85}Ga_{0.15}As$ layer 13 for detectors 3, 5, and 7, respectively. Assuming that the generation-recombination is the main source of conductance near 0 V, one can calculate $\tau_{eff}$ (using these conductance values) for $In_{0.53}Ga_{0.47}As$ and $In_{0.7}Ga_{0.3}As$ layers 9, 11, respectively, to be 1.1 μs and 61 ns, respectively, which is in good agreement with values calculated from the dark current.

The contribution from shunt current, given by:

$$I_{ohm} = V/R_{eff} \quad (4)$$

where $R_{eff}$ is the effective resistance, was found to be much greater for $In_{0.7}Ga_{0.3}As$ and $In_{0.85}Ga_{0.15}As$ detectors, where $R_{eff}$ was approximately 3–4 MΩ, while for $In_{0.53}Ga_{0.47}As$ detector, $R_{eff}$>5 ΩG. This may also be due to the larger number of defects in the $In_{0.7}Ga_{0.3}As$ and $In_{0.85}Ga_{0.15}As$ layers, but the physical origin of the shunt conduction is not clear.

The diffusion current is negligible except for the $In_{0.85}Ga_{0.15}As$ detector. The diffusion current is given by:

$$i_{diff} = qn_i^2 \sqrt{\frac{D_p A}{\tau_d N_d}} \quad (5)$$

where $D_p$ is hole diffusion constant, $\tau_d$ is the minority carrier diffusion lifetime, and $N_d$ is the doping density. The diffusion current depends exponentially on the bandgap which is smallest for the $In_{0.85}Ga_{0.15}As$ layer 13, where $\tau_d$ was estimated to be 500 ps.

Note that the tunneling current contribution to the dark current was not observed for the $In_{0.7}Ga_{0.3}As$ and $In_{0.53}Ga_{0.15}As$ detectors 5 and 7 due to the large component of generation, diffusion, and shunt currents. It is believed that the integration and processing of the three-detector pixel in the above example for detector array 1 does not significantly degrade individual device performance.

Figure 3:
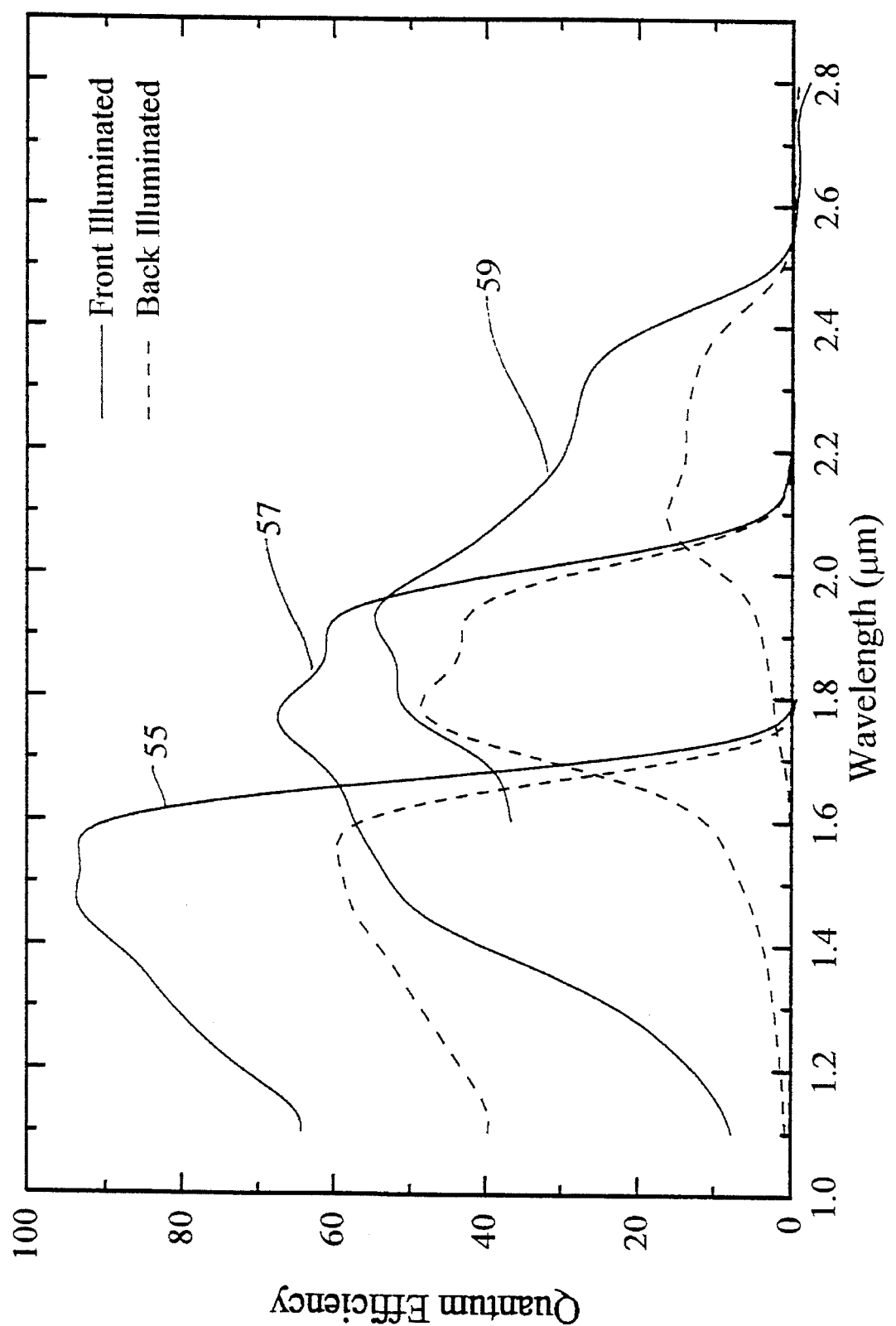
FIG. 3 shows a plot of quantum efficiency versus wavelength for each one of the three detector regions of the device of FIG. 1A.

The quantum efficiency of each detector 3, 5, and 7 under front (light incident from the associated pn junction) and back illumination is shown in plots 55, 57, and 59, respectively, of FIG. 3. The measurements were made under a reverse bias of 3.5, 6.0, 5.0 volts for $In_{0.53}Ga_{0.47}As$, $In_{0.85}Ga_{0.3}As$, and $In_{0.85}Ga_{0.15}As$ detectors 3, 5, and 7, respectively. The measured long wavelength cutoffs of 1.7, 2.1, and 2.5 μm correspond to the bandgaps of the absorption layer materials. The short wavelength cutoff for the device 1 under back illumination is determined by the light absorption properties of layers between the substrate 15 and the absorption layers 9, 11, and 13. For example, for the $In_{0.7}Ga_{0.3}As$ layer forming detector 5, light absorbed in the underlying $In_{0.53}Ga_{0.47}As$ layer 9 will not be detected, thus the short wavelength cutoff of the $In_{0.7}Ga_{0.3}As$ detector 5 is approximately equal to the cutoff wavelength of $In_{0.5}Ga_{0.47}As$ layer 9. The peak quantum efficiency under front illumination ranges from 55 to 95%. For the $In_{0.85}Ga_{0.15}As$ detector 7, the peak quantum efficiency was determined to be 55%. This lower than expected efficiency is believed due, in part, to the large number of heterojunctions and layers underlying the detectors, increasing the probability of the carrier being captured and recombining at traps prior to being collected. Also, the fact that the diffusion of Zn is faster in $In_{0.85}Ga_{0.15}As$ layer 13 compared with the other absorption layers 9 and 11, caused the thickness of the depleted absorption region to be less than optimum (<2 μm) in this detector 1, affecting its quantum efficiency. The peak quantum efficiency under back illumination (between 15% and 60%) is somewhat lower than for front illumination since the antireflective coating was deposited only on the top surface of device 1, in this particular example.

In summary of one embodiment of the invention, as described above, a novel three wavelength InGaAs focal plane array pixel element 1 for detection at wavelengths from 0.9–2.6 μm is shown, where each of three wavelength-sensitive detectors 3, 5, and 7 are individually addressable. This device 1 consists of successively smaller bandgap layers of $In_xGa_{1-x}$ (x≥0.53) 9, 11, and 13, grown on an InP substrate 15, separated by layers of $InAs_yP_{1-y}$ to decrease defects induced by lattice mismatch strain with the substrate 15. The various layers were selectively removed so that pn junctions with different wavelength response can be separately contacted. All three detectors 3, 5, and 7 have quantum efficiencies between 15 and 95% (depending on wavelength and illumination direction) and dark currents from 0.01 to 10 mA cm$^2$—values comparable to discrete photodiodes with similar wavelength responses.

Figures 5A, 5B:
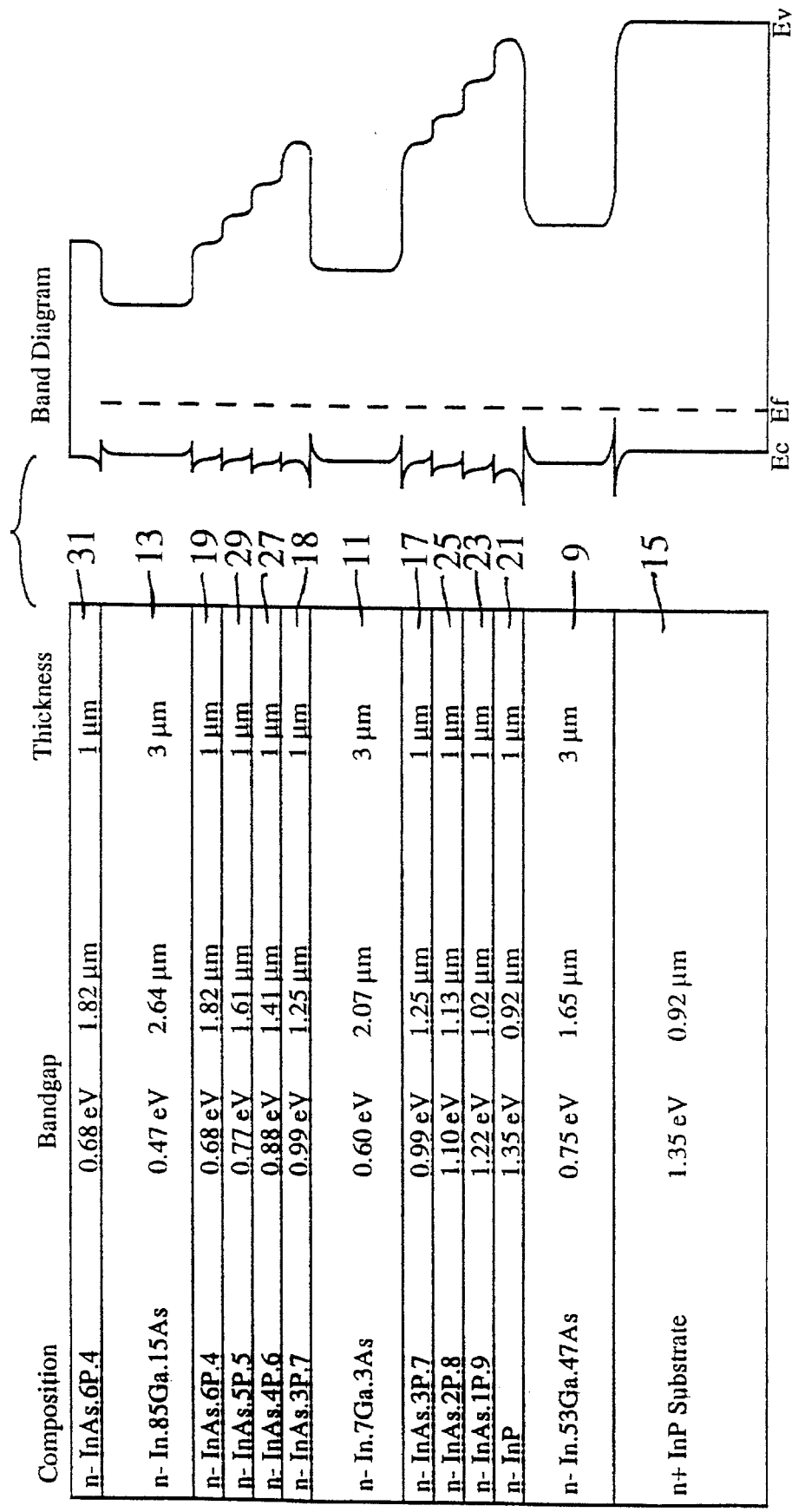
FIG. 5A shows a simplified cross section of the epitaxial structure of an ideal device for another embodiment of the invention.
FIG. 5B shows a band diagram illustrating the band gaps for each one of the corresponding layers of the device of FIG. 5A.

To improve the performance of the three wavelength infrared focal plane array detector 1 of FIGS. 1A, and 1B, the present inventors believe that the modified device as shown in FIG. 5A is preferred. As shown, relative to the prototype detector element 1 of FIG. 1B, the preferred embodiment thereof of FIG. 5A includes an additional transparent strain relief layer 18 between absorption layer 11 and strain relief layer 27, as shown. Improved performance is expected to be obtained in that the lattice parameter of the InAs$_{0.3}$P$_{0.7}$ layers 17 and 18, immediately below and above the absorption layer 11, are matched. In this manner, the magnitude of the dark current associated with absorption layer 11 is expected to be reduced, as previously indicated above. Also, the improved performance can be observed by comparing the band diagram shown in FIG. 1C for the prototype device 1, relative to the band diagram of FIG. 5B for the preferred configuration of FIG. 5A, whereby as shown the bandgap is extended for strain relief layers 19, 29 and 27, by the addition of strain relief layer 18.

Figure 6:
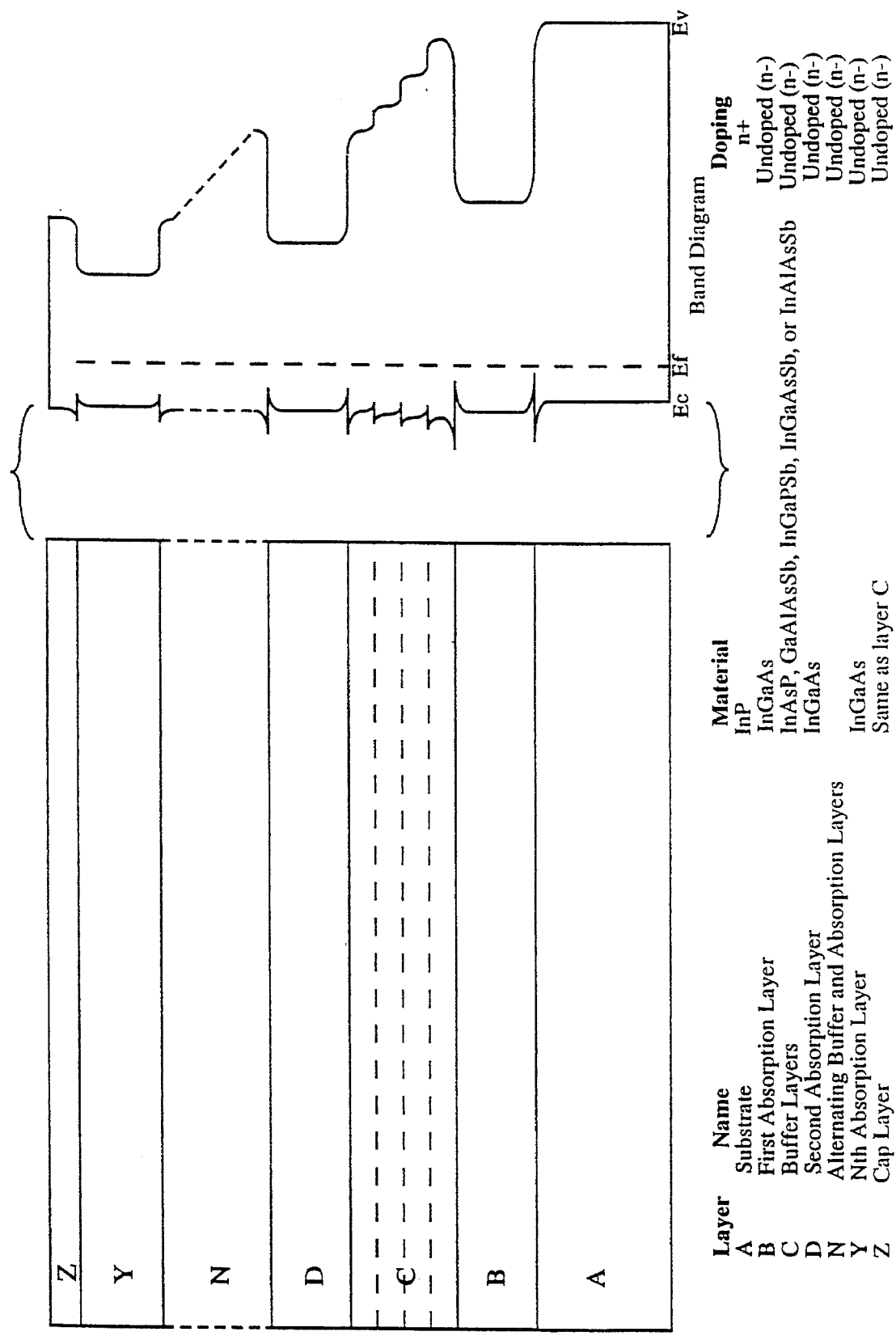
FIG. 6 shows a cross section of the epitaxial structure of an N-color device of another embodiment of the invention in association with a corresponding band diagram for showing the band gaps of each of the layers.

The present invention, within practical limits, can be extended to provide a focal plane array detector element capable of detecting "N" different wavelengths, where N is any integer number 1, 2, 3, 4, 5, . . . , N. As shown in FIG. 6, such a device includes a cap layer Z, analogous to layer 31 of FIG. 5A, a substrate A, a first absorption layer B, over a strain relief layers C (analogous to layers 17, 25, 23, and 21 of the device of FIG. 5A), a second absorption layer D, followed by alternating buffer absorption layers to the Nth order or degree, followed by an Nth absorption layer, followed by the previously mentioned cap layer Z. The material for each of these layers is generally indicated in the legend in FIG. 6, as is the doping for each of these layers. Also, a band diagram is included showing the bandgaps of the various layers associated with the N absorption layer device of FIG. 6.

Although various embodiments of the invention are described herein for purposes of illustration, they are not meant to be limiting. Those of skill in the art may recognize modifications that can be made in the illustrated embodiments. Such modifications are meant to be covered by the spirit and scope of the appended claims. For example, a plurality of pixels each providing the capability of detecting up to (N+1) different wavelengths of light can be provided on a common substrate, with each pixel including (N+1) detectors, thereby providing an array of such pixels through use of the present invention.

What is claimed is:

1. A method for making a multiwavelength focal plane array light detector, comprising the steps of:

doping a substrate to have a first conductivity, said substrate having a top and a bottom;

epitaxially growing a plurality of (N+1) absorption layers over the top of said substrate, with each absorption layer being configured for detecting different wavelengths of light, respectively, where N=1,2,3 . . . ;

upon individually completing the epitaxial growth of each one of said absorption layers, epitaxially growing thereover a plurality of layers of light transparent buffer layers of said first conductivity, for sandwiching all but the topmost and bottommost ones of said absorption layers between a plurality of said buffer layers, said buffer layers having substantially increasing lattice parameters, respectively, relative to said substrate, for substantially preventing propagation of lattice mismatch dislocations through successive ones of said absorption layers;

epitaxially growing a cap layer over a top face of the topmost one of said absorption layers;

wet etching through a first portion of said cap layer for exposing an area of the topmost one of said absorption layers;

etching via wet or reactive ion (dry) etching through (N+1) different portions of said cap layer, and said plurality of buffer layers overlying remaining ones of said plurality of (N+1) absorption layers, respectively, for exposing an area of each;

diffusing dopant into the exposed areas of said plurality of (N+1) absorption layers, for doping each area to have a second conductivity opposite that of said first conductivity;

forming a plurality first ohmic contacts on a portion of each one of the exposed areas of said plurality of (N+1) absorption layers, respectively; and forming a second ohmic contact on the bottom of said substrate.

2. The method of claim 1, further including the steps of:

depositing an antireflective coating over the top of said substrate to cover all but said first ohmic contacts; and depositing an antireflective coating on the bottom of said substrate to cover all but said second ohmic contact.

3. The method of claim 1, further including the step of forming said second ohmic contact into a grid for exposing a sufficient area of the bottom of said substrate to permit back illumination thereof.

4. The method of claim 1, wherein said step of epitaxially growing a plurality of (N+1) absorption layers includes the step of:

selecting In$_x$Ga$_{1-x}$As (X≧0.53) material for each one of said absorption layers, in a manner providing successively decreasing bandgaps, respectively, relative to said substrate.

5. The method of claim 4, wherein said steps of epitaxially growing a plurality of buffer layers between each one of said absorption layers, includes the step of:

selecting InAs$_y$P$_{1-y}$ (y≦1) material for each one of said buffer layers, in a manner providing increasing lattice parameters for said plurality of buffer layers the further removed one is from said substrate, respectively.

6. The method of claim 5, wherein said step of selecting InAs$_y$P$_{1-y}$ material includes for each buffer layer immediately above and below a given one of said plurality absorption layers, making the material composition thereof substantially identical for equating the lattice parameters thereof, respectively.

7. The method of claim 5, wherein said wet etching step includes the steps of:

using an etching solution of Citric Acid: H$_2$O$_2$ at 5:1 for etching the In$_x$Ga$_{1-x}$As material of said absorption layers; and using an etching solution of HCl:H$_3$PO$_4$:H$_2$O$_2$ at 3:1:z, where z is varied from 0 to 3 relative to an arsenic concentration in said buffer layers.

8. The method of claim 7, further including immediately before said wet etching step, the step of depositing a SiN$_x$ film on the top of said substrate.

9. The method of claim 8, further including as the initial step of said wet etching step, the step of defining an etch area via photolithography at each location on the top of said substrate where etching is to be performed for exposing an area of an underlying said absorption layer.

10. The method of claim 5, wherein said diffusing step includes the steps of:

depositing a $SiN_x$ diffusion mask on top of said substrate;

defining a diffusion area for each exposed absorption layer area; and diffusing Zinc Arsenide into each one of said exposed absorption layer areas.

11. The method of claim 10, further including the steps of:

depositing a $SiN_x$ antireflective coating on the top of said substrate; and depositing a $SiN_x$ antireflective coating on the bottom of said substrate.

12. The method of claim 11, wherein said step of forming said first ohmic contact includes the step of:

selecting Au—Zn alloy material for said first ohmic contacts; and placing said Au—Zn alloy first ohmic contacts on each one of said diffused areas of said absorption layers, respectively, via a photoresist lift-off process.

13. The method of claim 12, wherein said step of forming said second ohmic contact includes the steps of:

selecting GeNiAu alloy material for said second ohmic contact; and placing said second ohmic contact on the bottom of said substrate via a photoresist lift-off process.

14. The method of claim 8, wherein the thickness of the said $SiN_x$ film is 1000 Å.

15. The method of claim 9, wherein said etch areas are each 500 micrometers square.

16. The method of claim 10, wherein said $SiN_x$ diffusion mask is 1000 Å.

17. The method of claim 10, wherein said diffusing step is run for 20–40 minutes at 500°–530° C.

18. The method of claim 11, wherein said $SiN_x$ antireflective coating is 2250 Å thick for both the top and bottom of said substrate.

19. The method of claim 12, wherein said first ohmic contacts are 40 micrometers square.

20. The method of claim 13, wherein said second ohmic contact is formed into a grid pattern with sufficient open areas to permit back illumination of said substrate.

21. The method of claim 1, wherein said steps of wet etching, diffusing, and forming a plurality of first ohmic contacts on a portion of the exposed areas of said (N+1) absorption areas, are used for providing on said substrate a plurality of columns of pixels each including (N+1) light wave detectors of different wavelengths, respectively, said pixels being arranged to provide an array.

* * * * *

UNITED STATES PATENT AND TRADEMARK OFFICE
CERTIFICATE OF CORRECTION

PATENT NO. : 5,518,934
DATED : May 21, 1996
INVENTOR(S) : Stephen R. Forrest, et al.

It is certified that error appears in the above-indentified patent and that said Letters Patent is hereby corrected as shown below:

In the ABSTRACT, line 1, change "local" to -- focal -- .

Column 1, line 41, change "$=1.65$" to -- $< 1.65$ -- .

Column 3, line 20, change "1!" to -- 11 -- .

Column 4, lines 30 and 31, change "500°14 530°C. to -- 500°C - 530°C -- .

Column 4, line 55, change "$In_{0.53}Ga_{0.15}As$" to -- $In_{0.85}Ga_{0.15}As$ -- .

Column 5, line 55, change "wk" to -- $k\Omega$ -- .

Column 6, line 18, change "$In_{0.53}Ga_{0.15}As$" to -- $In_{0.85}Ga_{0.15}As$ -- .

Column 6, line 28, change "$In_{0.85}Ga_{0.3}As$" to -- $In_{0.7}Ga_{0.3}As$ -- .

UNITED STATES PATENT AND TRADEMARK OFFICE
CERTIFICATE OF CORRECTION

PATENT NO. : 5,518,934
DATED : May 21, 1996
INVENTOR(S) : Stephen R. Forrest, et al.

It is certified that error appears in the above-indentified patent and that said Letters Patent is hereby corrected as shown below:

Column 6, line 39, change "$In_{0.5}Ga_{0.47}As$" to -- $In_{0.53}Ga_{0.47}As$ -- .

Signed and Sealed this

Tenth Day of September, 1996

Attest:

BRUCE LEHMAN

Attesting Officer    Commissioner of Patents and Trademarks